(12) United States Patent
Dean

(10) Patent No.: US 7,635,832 B2
(45) Date of Patent: Dec. 22, 2009

(54) HYBRID DIVERSITY METHOD UTILIZING ADAPTIVE DIVERSITY FUNCTION FOR RECOVERING UNKNOWN ABERRATIONS IN AN OPTICAL SYSTEM

(75) Inventor: Bruce H. Dean, New Market, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 692 days.

(21) Appl. No.: 11/469,105

(22) Filed: Aug. 31, 2006

(65) Prior Publication Data

US 2008/0040077 A1 Feb. 14, 2008

Related U.S. Application Data

(60) Provisional application No. 60/713,616, filed on Aug. 31, 2005.

(51) Int. Cl.
*H01L 27/00* (2006.01)

(52) U.S. Cl. .................................. 250/208.1; 250/201.7

(58) Field of Classification Search ................. 250/216, 250/201.2–201.7, 208.1; 382/103, 167, 254–275; 359/618, 626, 639, 707–722, 749, 775
See application file for complete search history.

(56) References Cited

U.S. PATENT DOCUMENTS

| 4,309,602 | A | 1/1982 | Gonsalves et al. |
|---|---|---|---|
| 4,748,321 | A | 5/1988 | Ishida et al. |
| 5,598,261 | A | 1/1997 | Duncan et al. |
| 5,610,707 | A | 3/1997 | Duncan et al. |
| 6,368,763 | B2 | 4/2002 | Dirksen et al. |
| 6,819,414 | B1 | 11/2004 | Takeuchi |
| 6,842,297 | B2 | 1/2005 | Dowski, Jr. |
| 7,245,742 | B2 * | 7/2007 | Carrano et al. ............. 382/103 |
| 2002/0159048 | A1 | 10/2002 | Inoue et al. |
| 2004/0052426 | A1 | 3/2004 | Landesman |
| 2004/0062453 | A1 | 4/2004 | Ludwig |
| 2004/0099787 | A1 | 5/2004 | Dolne et al. |
| 2004/0190762 | A1 | 9/2004 | Dowski, Jr. et al. |

* cited by examiner

*Primary Examiner*—Que T Le
(74) *Attorney, Agent, or Firm*—Christopher O. Edwards

(57) ABSTRACT

A method of recovering unknown aberrations in an optical system includes collecting intensity data produced by the optical system, generating an initial estimate of a phase of the optical system, iteratively performing a phase retrieval on the intensity data to generate a phase estimate using an initial diversity function corresponding to the intensity data, generating a phase map from the phase retrieval phase estimate, decomposing the phase map to generate a decomposition vector, generating an updated diversity function by combining the initial diversity function with the decomposition vector, generating an updated estimate of the phase of the optical system by removing the initial diversity function from the phase map. The method may further include repeating the process beginning with iteratively performing a phase retrieval on the intensity data using the updated estimate of the phase of the optical system in place of the initial estimate of the phase of the optical system, and using the updated diversity function in place of the initial diversity function, until a predetermined convergence is achieved.

20 Claims, 11 Drawing Sheets

HYBRID DIVERSITY METHOD UTILIZING ADAPTIVE DIVERSITY FUNCTION FOR RECOVERING UNKNOWN ABERRATIONS IN AN OPTICAL SYSTEM

CROSS REFERENCE TO RELATED APPLICATIONS

The benefit of priority is claimed under 35 U.S.C. 119(e) of commonly assigned U.S. Provisional Patent Application No. 60/713,616, filed Aug. 31, 2005, entitled "Wavefront Sensing Devices and Methods," which is incorporated by reference herein in its entirety.

STATEMENT OF GOVERNMENT INTEREST

The invention described herein was made by an employee of the United States Government and may be manufactured and used by or for the Government of the United States of America for governmental purposes without the payment of any royalties thereon or therefor.

FIELD OF THE INVENTION

The present invention relates generally to optical systems and, in particular, to the recovery of aberrations in optical systems.

BACKGROUND OF THE INVENTION

Phase retrieval is an image-based wavefront sensing method that utilizes point-source images or other known objects to recover optical phase information.

Conventional image-based phase retrieval techniques may be classified into two general categories: iterative-transform methods and parametric methods. Modifications to the original iterative-transform approach have been based on the introduction of a defocus diversity function or on the input-output method. Various implementations of the focus-diverse iterative-transform method have appeared that deviate slightly by utilizing a single wavelength or by varying the placement and number of defocused image planes. Modifications to the parametric approach include minimizing alternative merit functions as well as implementing a variety of nonlinear optimization methods such as Levenburg-Marquardt, simplex, and quasi-Newton techniques. The concept behind an optical diversity function is to modulate a point source image in a controlled way. The purpose of a diversity function in wavefront sensing is to "spread out" the optical response to expose aberration information. In principle, any known aberration can serve as a diversity function, but defocus is often the simplest to implement and exhibits no angular dependence as a function of the pupil coordinates. Since defocus has only angular dependence, no one part of the point spread function is emphasized more than any other.

The iterative-transform method can result in phase retrieval recoveries with higher spatial frequency content than is practical with parametric methods that solve directly for aberration coefficients of a given basis set, such as, for example, a Zernike basis set. From a different viewpoint, the method operation may be analyzed as consecutive projections onto convex sets. A disadvantage of the iterative-transform approach is that recovery results are prone to spurious phase values and branch points, as well as wrapped phase values for aberration contributions larger than one wave. As a result, it is well known that the iterative-transform method, while especially suited for high-spatial frequency phase recoveries, has a limited dynamic range when compared with the parameter-based approach, in which multi-wave recoveries are possible but are generally of lower spatial frequency. Multi-wave phase recoveries are possible, but generally require an additional phase-unwrapping post-processing step.

One particular approach is the Misell-Gerchberg-Saxton (MGS) method. The MGS approach is well suited for high spatial frequency phase map recoveries, but is not well suited for multi-wave recoveries, due to the well-known $2\pi$ phase wrapping problems inherent in the iterative-transform approach. Nevertheless, the MGS method approach can be utilized for multi-wave phase recoveries but requires an additional phase-unwrapping post-processing step.

For the reasons stated above, and for other reasons stated below, which will become apparent to those skilled in the art upon reading and understanding the present specification, there is a need in the art for alternative approaches for recovering aberrations in optical systems.

SUMMARY OF EXEMPLARY EMBODIMENTS

Particular embodiments of the method of the present invention are presented. It should be understood that the invention, in its broadest sense, could be practiced without having one or more features of these embodiments. It should also be understood that these embodiments are merely exemplary.

In one embodiment, the invention provides a method of recovering unknown aberrations in an optical system, comprising collecting intensity data produced by the optical system, generating an initial estimate of a phase of the optical system, iteratively performing a phase retrieval on the intensity data to generate a phase estimate using an initial diversity function corresponding to the intensity data, generating a phase map from the phase retrieval phase estimate, decomposing the phase map to generate a decomposition vector, generating an updated diversity function by combining the initial diversity function with the decomposition vector, generating an updated estimate of the phase of the optical system by removing the initial diversity function from the phase map. The method may further comprise repeating the process beginning with iteratively performing a phase retrieval on the intensity data using the updated estimate of the phase of the optical system in place of the initial estimate of the phase of the optical system, and using the updated diversity function in place of the initial diversity function, until a predetermined convergence is achieved.

In another embodiment, the invention provides a method of recovering unknown aberrations in an optical system, comprising introducing one or more known aberrations into the optical system, for each known aberration, collecting intensity data produced by the optical system, generating an initial estimate of a phase of the optical system, iteratively performing a phase retrieval on each set of the intensity data to generate a phase estimate using an initial diversity function corresponding to the sets of the intensity data, combining each of the phase retrieval phase estimates to generate a phase map, decomposing the phase map to generate a decomposition vector, generating an updated diversity function by combining the initial diversity function with the decomposition vector, generating an updated estimate of the phase of the optical system by removing the initial diversity function from the phase map. The method may further comprise repeating the process beginning with iteratively performing a phase retrieval on each set of the intensity data using the updated estimate of the phase of the optical system in place of the initial estimate of the phase of the optical system, and using the updated diversity function in place of the initial diversity function, until a predetermined convergence is achieved.

Aside from the structural and procedural arrangements set forth above, the invention could include a number of other arrangements, such as those explained hereinafter. It is to be understood that both the foregoing description and the following description are exemplary only.

DETAILED DESCRIPTION OF EXEMPLARY EMBODIMENTS

In the following detailed description of embodiments of the invention, reference is made to the accompanying drawings that form a part hereof, and in which are shown by way of illustration specific embodiments that may be practiced. These embodiments are described in sufficient detail to enable those skilled in the art to practice disclosed subject matter, and it is to be understood that other embodiments may be utilized and that process changes may be made without departing from the scope of the claimed subject matter. The following detailed description is, therefore, not to be taken in a limiting sense, and the scope of the claimed subject matter is defined only by the appended claims and equivalents thereof.

Performance of optical systems, such as those found in cameras, telescopes, microscopes, and other systems for the collection of images, can often be improved by actively correcting for aberrations in the optical system. Wavefront sensing is a technique to obtain phase information from a wavefront to recover such aberrations.

In one application, the method of the present invention may be utilized on a space-based telescope, such as NASA's James Webb Space Telescope (JWST), for example. On JWST, the primary mirror is a 6.5 meter segmented mirror having 18 segments in a hexagonal array. The method according to an embodiment of the invention may be used with an image-based wavefront sensing and control system in such a telescope to align the mirror segments, minimize the effects of figure error, and position the secondary mirror of the three-mirror anastigmat design. The wavefront sensing method specified for JWST is image-based in the sense that point-source stellar images are collected and processed to recover optical phase information. In addition to wavefront sensing and control applications with active and adaptive optical systems, embodiments of the invention may be used for optical system verification and testing, such as, for example, quantitative measurement of optical system performance. The optical systems in those applications may comprise at least one of a lens, a mirror, an imaging system, a camera, a detector, and a laser. The optical systems may also comprise compound systems, including combinations of those elements.

In one example, the method of the present invention has been used in an image-based wavefront sensing and control system in a meter-class laboratory-based testbed telescope. Several exemplary embodiments of the method will be described with reference to the testbed telescope.

Figure 1:
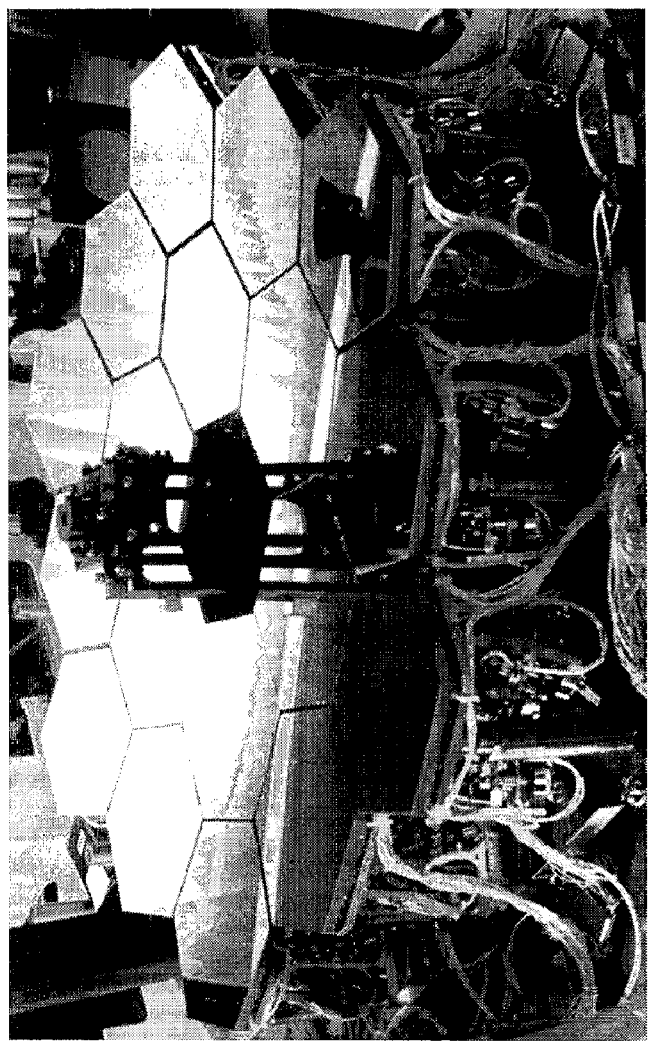
FIG. 1 is a schematic and photograph of the testbed telescope optical design and primary mirror used in validating embodiments of the invention.
Figure 1:
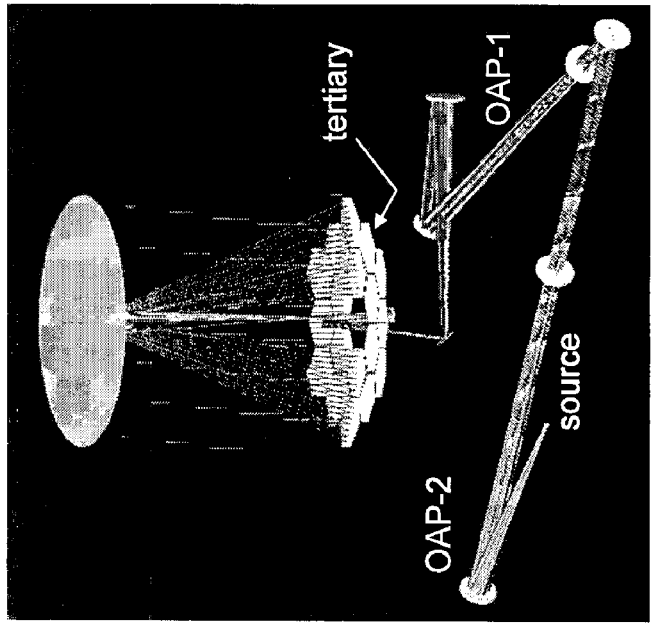

FIG. 1 shows a schematic and a photograph of the testbed telescope optical design and primary mirror. While the embodiments will be described with reference to their use with the testbed telescope, it is noted that the methods described herein are applicable to a variety of other optical systems, including monolithic mirror systems, compound lens systems, and other optical systems adapted to generate a wavefront in response to a source.

The various embodiments described herein will be referred to as a Hybrid Diversity Method (HDM). According to some embodiments, the method produces an unwrapped phase result, and may be based on a more direct computational procedure, thus eliminating additional post-processing steps of traditional phase retrieval processes. Further, some embodiments may facilitate high-speed multi-processor implementations for reduced latency.

The HDM may utilize an iterative-transform phase retrieval approach, without focusing on a convergence of the iterative-transform phase retrieval or utilizing a phase-unwrapping post-processing step. Instead, embodiments of the HDM utilize a floating, i.e., adaptive, diversity function to incorporate feedback during phase recovery to guide the phase retrieval process. Further, some embodiments of the method may resolve issues associated with conventional iterative-transform phase retrieval, including the convergence criterion, and unbiased phase estimation, as detailed below.

Iterative-transform phase retrieval is pixel-based, i.e., it operates by iteratively enforcing known constraints between conjugate Fourier domains to recover point-by-point phase maps. This approach has been termed the "error-reduction" method in the literature.

Various embodiments of the invention may use a variety of iterative-transform phase retrieval processes, and are not limited to the types discussed above with reference to conventional methods.

Embodiments of the invention may overcome limitations in the dynamic range of the conventional iterative-transform approach because no phase wrapping occurs when a multi-wave aberration is incorporated as a known diversity function. That is, for focus-diverse phase retrieval according to embodiments of the invention, the diversity defocus term is often orders of magnitude larger than other unknown aberrations in the system. Therefore, in those embodiments, if the unknown aberrations can be converted to a known diversity function during the recovery process, then point-by-point phase recoveries of multi-wave aberrations may be realized without a phase-unwrapping post-processing step. In some embodiments, this is achieved by transferring the resulting sensed aberration into a continually updated, i.e., adaptive, diversity function during the recovery process. In other words, in those embodiments, the method incorporates feedback. The final aberration estimate may comprise the diversity function itself, after subtraction of any other known diversity components. As a result, the method may produce a null, i.e., a flat, as the aberration content is continually fed into the diversity function during subsequent iterations of the method.

Figure 2:
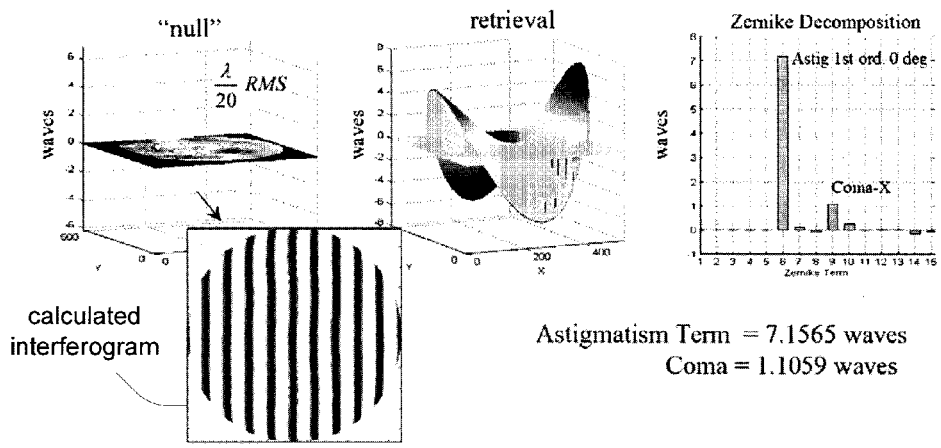
FIG. 2 is a visualization of phase estimation in accordance with an embodiment of the invention.
Figure 3:
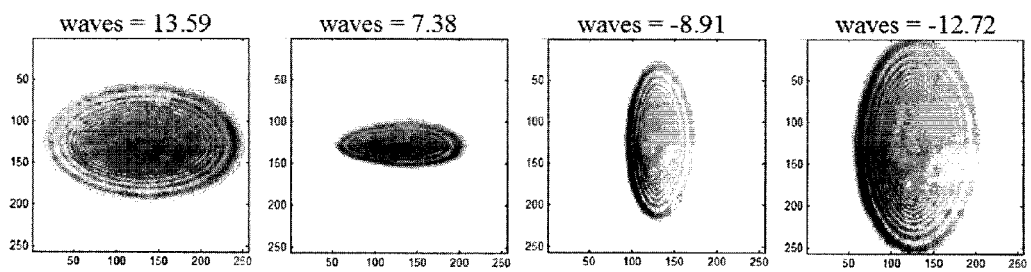
FIG. 3 is a visualization of intensity data used for the phase estimation of FIG. 2.

FIG. 2 is a visualization of phase estimation in accordance with an embodiment of the invention, illustrating an example of the high dynamic range phase estimation that is possible with the HDM (1λ=633 nm). FIG. 3 is a visualization of intensity data used as input for the phase estimation of FIG. 2. As depicted in FIG. 2, multi-wave amplitude aberrations, i.e., astigmatism of 7.1565 waves and coma of 1.1059 waves, are recoverable using embodiments of the invention, producing a null with a root mean square (RMS) wavefront error of a small fraction of its wavelength. A direct interferometer comparison with an interferogram calculated from the HDM results in this example provided agreement to 17 nm RMS at a wavelength of 633 nm, or less than 0.5% RMS recovery error. Although a point-source was used to generate the various examples shown herein, other sources are suitable for use with embodiments of the invention, such as extended known sources and extended unknown sources. As used herein, "extended source" means any multi-dimensional source, generally not approximating a point-source, whether it is of known or unknown dimensions.

As discussed above, this nulling behavior of some embodiments of the method in turn may provide a natural convergence criterion, since the measure of convergence may now be based on the RMS wavefront error of the null (similar to specifying the figure quality of an optical reference flat). Being adaptive in nature, some embodiments of the method may reduce the estimation bias that stems from imperfect prior knowledge of the diversity function. That is, diversity defocus is not perfectly known at the outset, but a refined and corrected estimate may be obtained during each iteration of the method. In one embodiment, the initial diversity function and/or phase estimate can be presumed to be some predetermined value. In one example, the predetermined value may be zero. Other non-zero values may also be used. In some embodiments, the initial phase estimate comprises the output of another method, such as an estimation method, for example.

Figure 4:
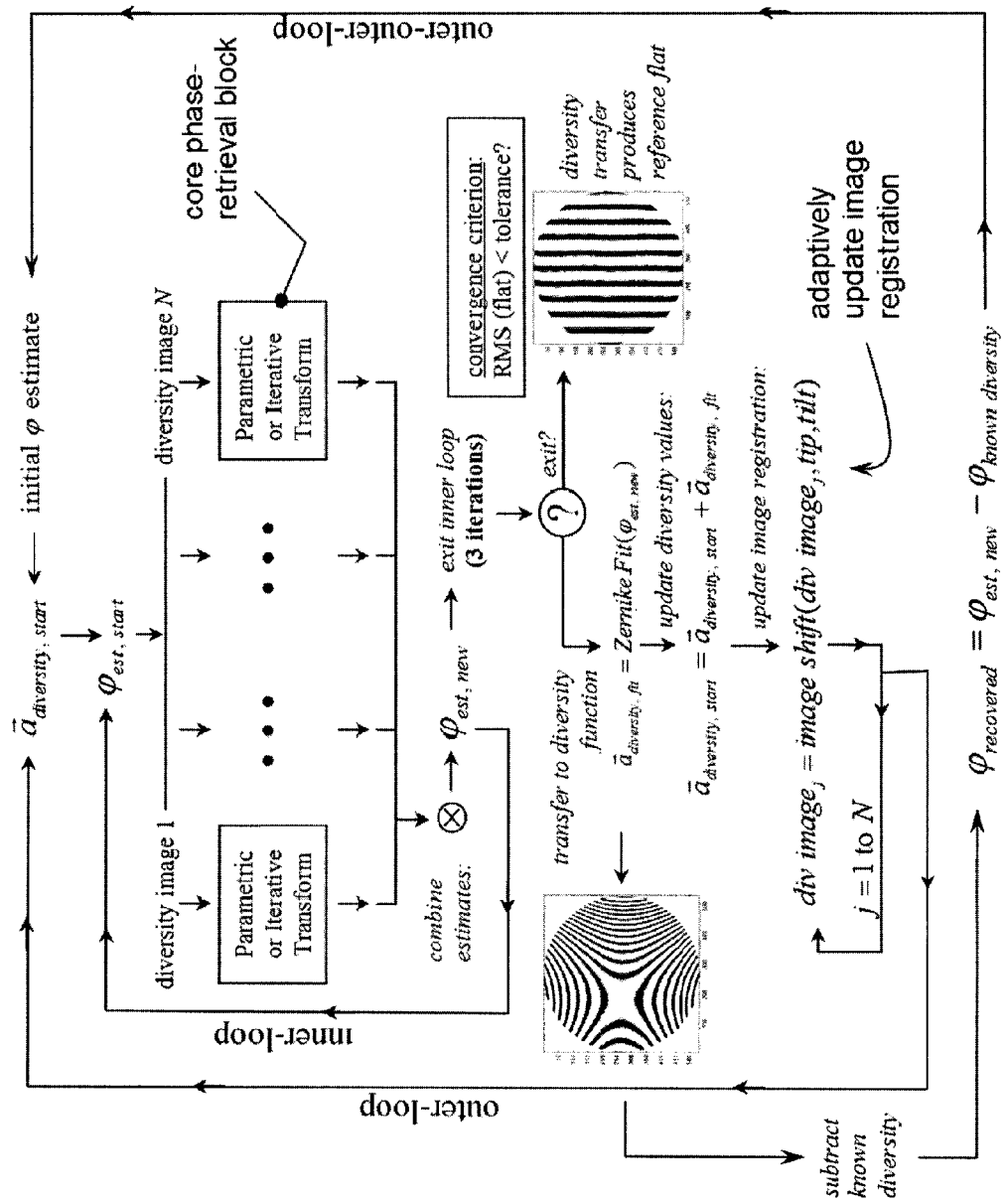
FIG. 4 is a block flow diagram of a method of recovering aberrations in an optical system in accordance with an embodiment of the invention.

FIG. 4 is a block flow diagram of a method for recovering aberrations in an optical system in accordance with an embodiment of the invention. An initial estimate of the phase is used to start the method, which is designed to process one or more intensity images simultaneously that differ in diversity defocus levels. These defocus levels may be chosen according to well known guidelines. However, such selection is not critical to performing the embodiments of the method described herein, as the embodiments may be performed with arbitrarily chosen levels of aberration. And while improved accuracy may be facilitated by using multiple images, the embodiments are suitable for use with only one set of intensity data, i.e., one wavefront image.

The embodiment of the invention described above utilizes focus diversity, in which a known defocus aberration is introduced into an optical system. Other embodiments may utilize other known aberrations, including, for example, one or more of piston, tip, tilt, defocus, astigmatism, coma, spherical, and trefoil.

As shown in FIG. 4, the individual images are then processed to obtain phase information. For example, the images may be processed using a nonlinear optimization procedure or a modified MGS iterative transform method. Some embodiments of the method are model-based in the sense that method parameters, such as defocus, f/#, wavelength, and detector pixel size, and data parameters, such as image bias and flux, are estimated directly from the image data as a pre-processing step prior to phase retrieval. This process may be handled, for example, using a nonlinear least squares or an optimization method such as the Levenburg-Marquardt method. In practice, the values of these parameters may affect how the Fourier transforms are implemented in the iterative-transform method.

As shown in FIG. 4, the output of the iterative-transform procedure at this stage is a phase estimate for each image of the defocus diversity data set. Any phase wrapping issues of the iterative-transform procedure may be ignored. These individual phase estimates are then combined, such as by using a weighted average (denoted by the ⊗ symbol), to form the phase estimate, $\phi_{est,new}$, as illustrated in FIG. 4 and labeled as the "inner-loop." It is well known that the iterative-transform method stagnates quickly after a relatively small number of iterations. Therefore, the overall method efficiency is improved from a computational standpoint by restricting the inner-loop iterations to a small number. In the implementation considered here, this process is repeated for three iterations to take advantage of the rapid initial gain in convergence that is characteristic of the iterative-transform method, while avoiding stagnation. Other numbers of iterations may also be used. Because of the feedback of the updated diversity function into subsequent iterative-transform phase retrieval calculations, the need to force convergence of any one iterative-transform procedure through repeated iterations may be obviated.

After exiting from the inner loop, a phase map is produced that is partially consistent with each image used in the data set. This phase map is then decomposed into a basis set for representation of wavefront data. A basis set may be selected that is suitable for the aperture shape. The basis set may comprise orthogonal or non-orthogonal functions. In one example, the phase map may be decomposed into a Zernike basis set for a given sampling and aperture shape. In another example, a fully orthogonal basis set may be used. The vector of decomposition coefficients may be written as:

$$\vec{a}_{diversity,fit} = \text{Orthogonal Fit}(\phi_{est,new}). \quad \text{Eq. (1)}$$

This process is shown in FIG. 4 where $\vec{a} = (a_1, a_2, \ldots, a_{nz})$ is the decomposition vector and $nz=\frac{1}{2}(z_{order}+1)(z_{order}+2)$ is the number of terms. These numerical values are then transferred to the previous diversity function using the update:

$$\vec{a}_{diversity,n} = \vec{a}_{diversity,n-1} + \vec{a}_{diversity,fit}. \quad \text{Eq. (2)}$$

This process may incorporate higher-order basis sets in the aberration off-loading process. Alternatively, the order four set (nz=15) may be utilized to capture the controllable modes of an optical system.

In the example implementation global tip and tilt correspond to the coefficients $a_2$ and $a_3$, which are used to update the image registration of individual diversity images. An updated diversity data set may then be produced for re-processing by the inner-loop via return to the outer-loop. In this embodiment, image registration may be adaptive and may be based on the amount of tip and tilt returned in the outer-loop iterations. Image-registration errors which may be present due to the image centering pre-processing step may be thus averaged out as the global tip and tilt are minimized by the method. Similarly, in some embodiments, imperfect knowledge of either the image f/# or diversity defocus value for individual images can lead to the recovery of an overall global defocus error. However, diversity data may optionally not be updated in performance of the methods.

This possibility of recovering a global defocus error is due to an ambiguity between f/# and defocus δz, which are related in the paraxial region by $$\delta z = 8 \lambda f_\#^2 a_{def}. \quad \text{Eq. (3)}$$

where $a_{def}$ is the defocus term in quadratic curvature units, i.e. $\phi_{def} = a_{def} \rho^2$ where $\rho$ is the normalized radial pupil coordinate. In the Zernike basis set the defocus coefficient, $a_5$, is related to the quadratic curvature coefficient by a factor of two: $a_5 = a_{def}/2$.

In the illustrated embodiment of the method, previous diversity defocus values are adaptively updated according to the recovery of global defocus in the phase estimate, $\phi_{est,new}$. In turn, as the amount of diversity defocus varies in each image, aberration recovery varies with differing amounts of defocus and, thus, feedback is incorporated into the recovery process. As shown, this process is continued until the global defocus error is driven to some predetermined convergence criteria, and may be driven substantially to zero.

In some embodiments, each aberration contribution may far exceed one wave after exiting the inner-loop portion of the method and, as is well known, the classical iterative-transform method cannot, by itself, recover multi-wave aberrations. Accordingly, the method may produce a wrapped phase map, $\phi_{est,new}$, in the absence of some form of aberration "off-loading." However, an aberration fitting procedure may still be applied in Eq. (1) to this wrapped phase data to return at least some portion of the multi-wave aberration to the variable $\vec{a}_{diversity,fit}$. These numerical values may then be transferred to the diversity function and become part of the known phase values. In this way, a multi-wave aberration may be recovered incrementally by successively applying the aberration fitting procedure to intermediate wrapped phase maps.

As shown in FIG. 4, during recovery, as more and more of the aberration is transferred to the diversity function following successive iterations of the outer loop, the estimated phase, $\phi_{est,new}$, no longer wraps since the multi-wave (unknown) aberration values become incorporated as part of the diversity function. As a result, $\phi_{est,new}$ begins to resemble a reference flat, i.e., a null (see FIG. 2), as the aberration content is transferred to the diversity function. The process of aberration transfer is illustrated in FIG. 4 with a calculated interferogram from both the adaptive diversity function, $\vec{a}_{diversity,fit}$, and the reference flat, $\phi_{est,new}$, as the method nears convergence for a wavefront dominated by astigmatism.

Figures 5A, 5B, 5C:
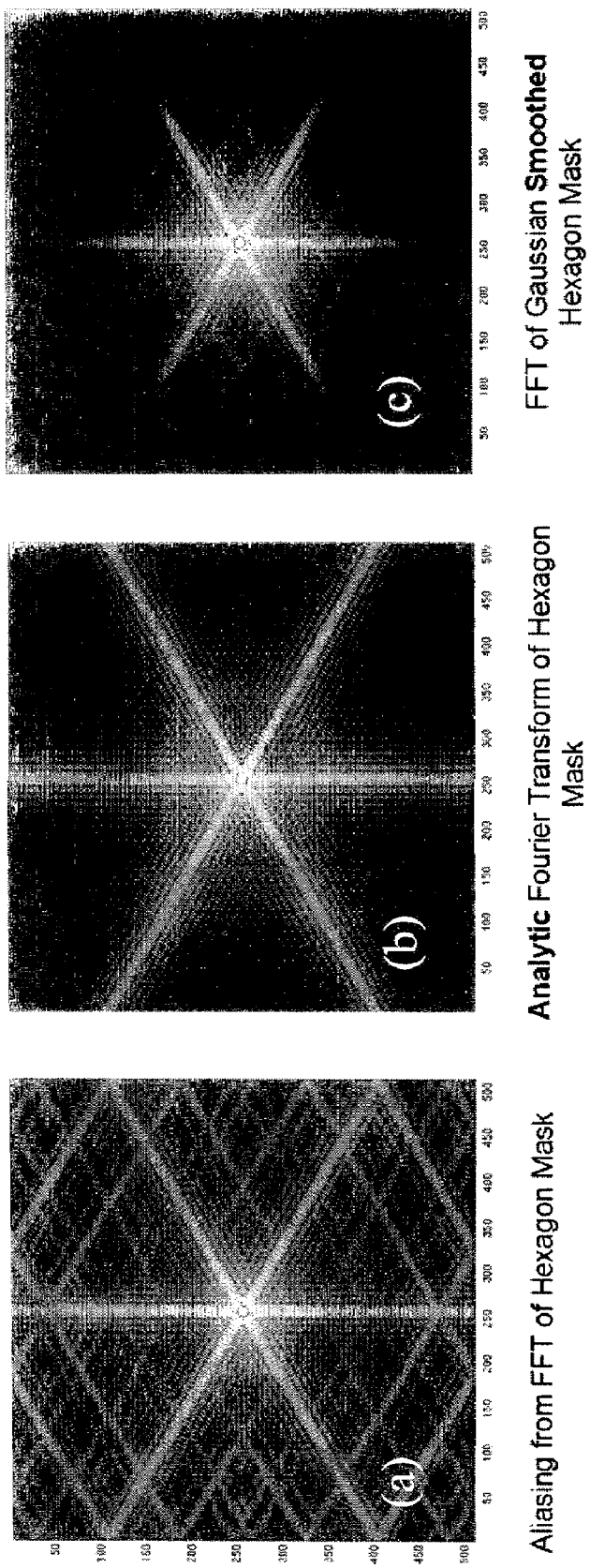
FIGS. 5a-5c are visualizations demonstrating filtering artificial phase artifacts from phase retrieval results for use with embodiments of the invention.

In some cases when representing obscurations or edges in the pupil constraint of the phase retrieval process, the Fourier transform used in diffraction modeling may alias power into the complex amplitude of the image plane point spread function (PSF). This artificial power may be problematic when using coarsely sampled edges and can contribute to an artificial and undesirable "ringing" that appears in the recovered phase maps. To reduce this phase artifact, the various embodiments may use a filtering technique based on Gaussian smoothing, to soften edges in a coarsely sampled aperture. Other techniques also exist, such as, for example, edge weighting based on the area of pixel coverage along a segment edge, and may be utilized with the various embodiments. FIGS. 5a-5c are visualizations demonstrating filtering artificial phase artifacts from phase retrieval results for use with embodiments of the invention. FIG. 5a shows an example of aliasing from a fast Fourier transform (FFT) of a hexagon mask without filtering. FIG. 5b shows the analytic, i.e., ideal, response of the same hexagon mask. FIG. 5c shows an example of aliasing from a FFT of a Gaussian-smoothed hexagon mask.

In some cases, the Gaussian-filtered result may compare more favorably to the analytical result, although some residual aliasing effects still appear. One may conclude from FIGS. 5a-5c, that a basic trade occurs between aliased power and the spatial frequency response of the FFT method. The implication for the iterative-transform process is that the mid- or higher-spatial frequency components may be damped in the recovered phase maps. This smoothing or filtering may effectively reduce artificial phase artifacts due to aliasing.

Figure 6:
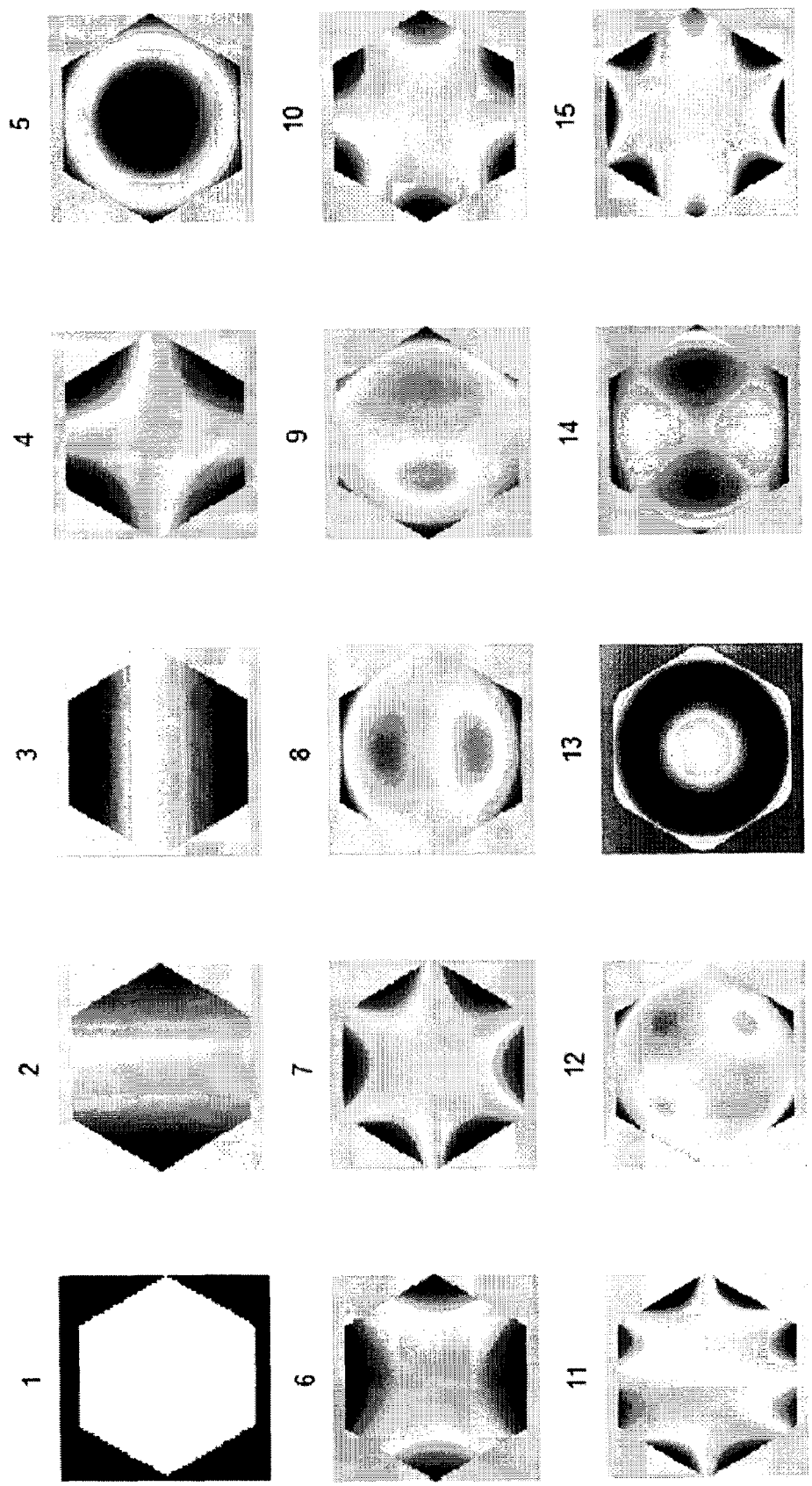
FIG. 6 is a visualization of one example of an orthogonal aberration basis set for use in reporting phase retrieval results and tracking aberration terms for use with embodiments of the invention.

As discussed above, orthogonal or non-orthogonal basis sets may be used with embodiments of the method of the invention. A basis set may be chosen that is best suited to the aperture under consideration. For example, the Zernike basis functions are orthogonal over a circular aperture. An alternative basis set may be developed for more complex shapes, such as, for example, the hexagonal apertures used herein for the example implementation with the testbed telescope mirror segments. Basis functions for hexagonal apertures, called "hexikes," have been previously derived. The order 4 modes (15 terms) are illustrated in FIG. 6.

Figure 7:
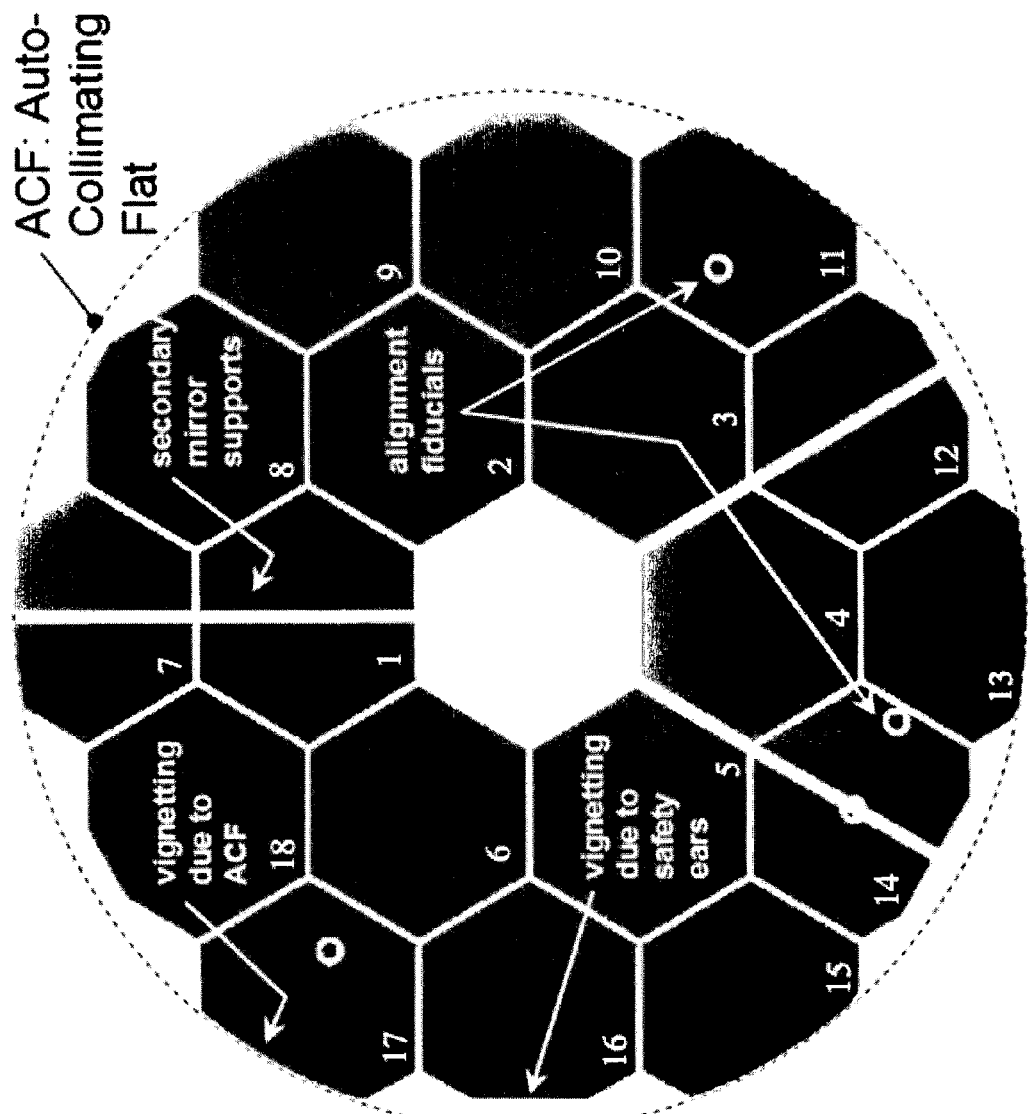
FIG. 7 is a diagram of the pupil geometry of the testbed telescope used in validating embodiments of the invention.
Figure 8:
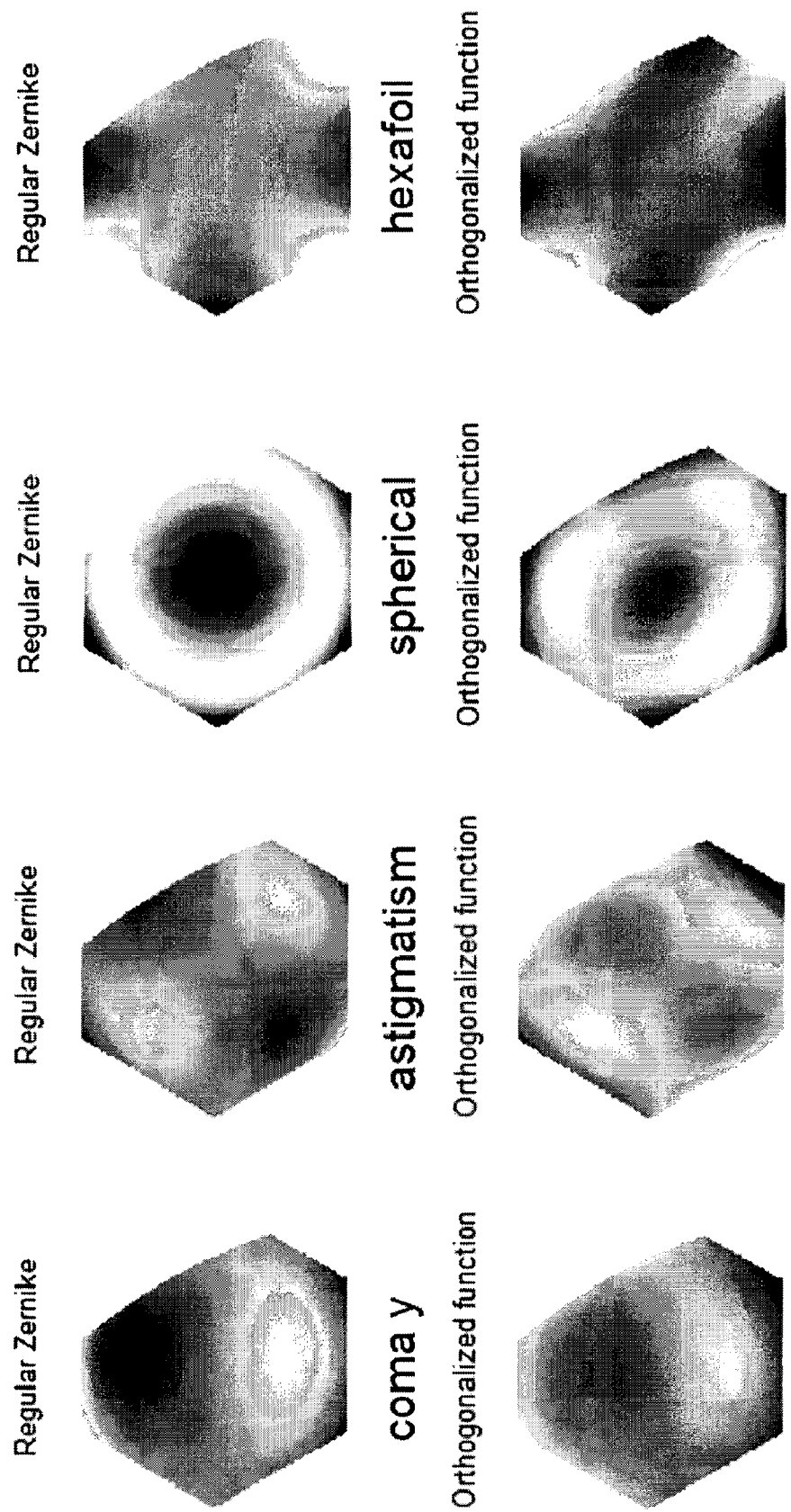
FIG. 8 is a visualization of orthogonal and non-orthogonal basis functions on segment 9 of the pupil geometry of FIG. 7 for use with embodiments of the invention.

The various embodiments are further adaptable to more complex geometries. For example, the testbed telescope pupil consists of more complicated apertures than the simple hexagonal shapes of the mirrors (see FIG. 7). Out of 18 testbed telescope segments, only five are regular hexagons, due to vignetting that results from alignment fiducials and secondary mirror safety support ears. The remaining segment apertures deviate significantly from hexagonal shapes. A set of orthogonal basis functions may be generated over a sampled irregular aperture starting from a set of "seed" basis functions, based on well-known Gram-Schmidt orthogonalization. FIG. 8 shows a comparison of how several of the orthogonal basis functions compare with the standard Zernike basis functions for segment 9 (selected arbitrarily). Such methods are applicable to other non-circular apertures.

Figure 9B:
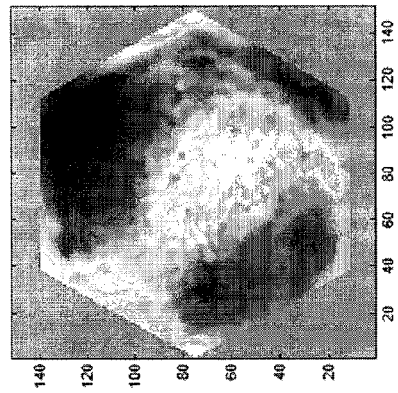
FIG. 9b is a visualization of a phase retrieval result from the diversity defocus image of segment 6 of FIG. 9a in accordance with an embodiment of the invention.
Figure 9C:
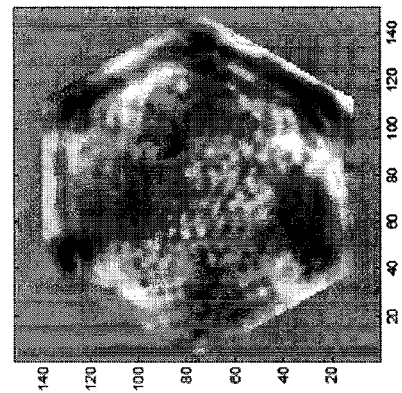
FIG. 9c is a visualization of a wavefront residual result resulting from the subtraction of the diversity defocus image of segment 6 of FIG. 9a from the phase retrieval result of FIG. 9b in accordance with an embodiment of the invention.
Figure 9A:
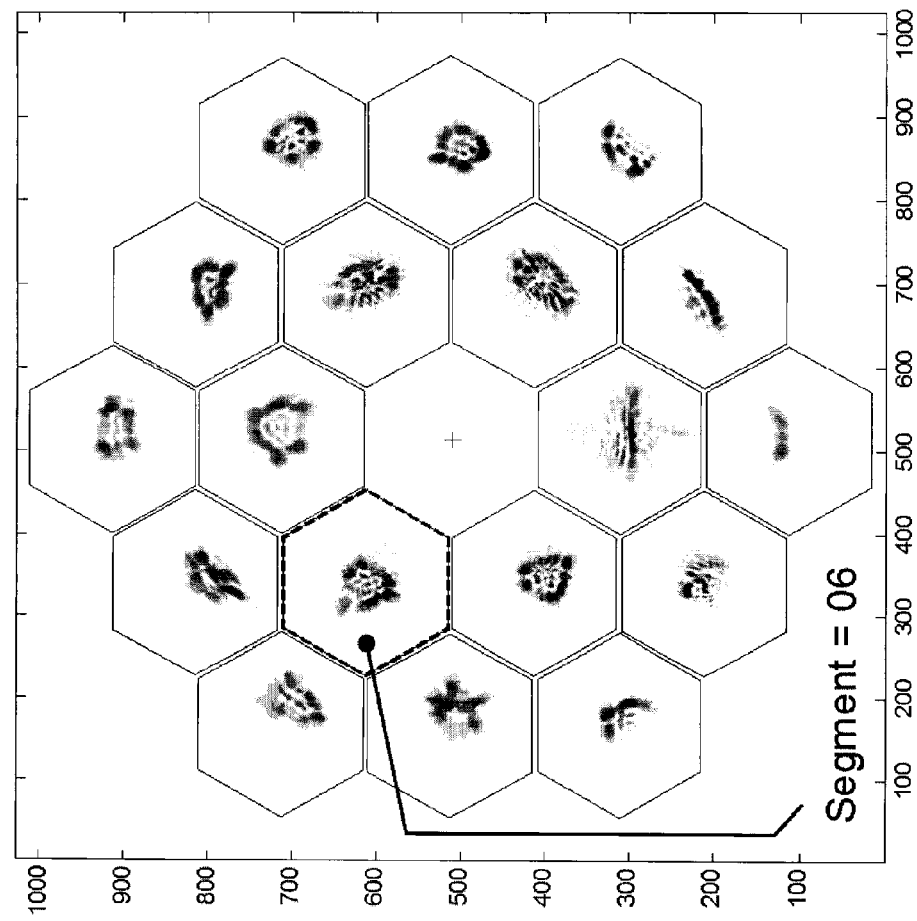
FIG. 9a is a visualization of diversity defocus images associated with individual testbed telescope primary mirror segments generated from a single source in accordance with an embodiment of the invention.
Figure 10A:
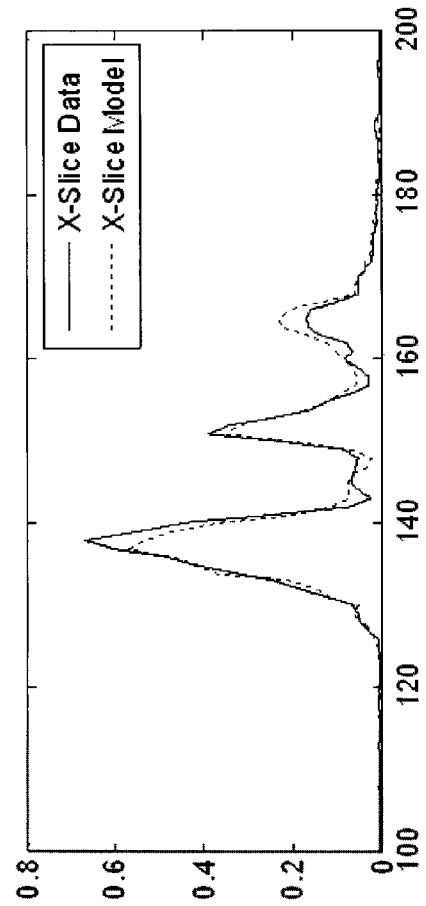
FIG. 10a is a visualization of intensity data of the diversity defocus image of segment 6 of FIG. 9a in accordance with an embodiment of the invention.
Figure 10B:
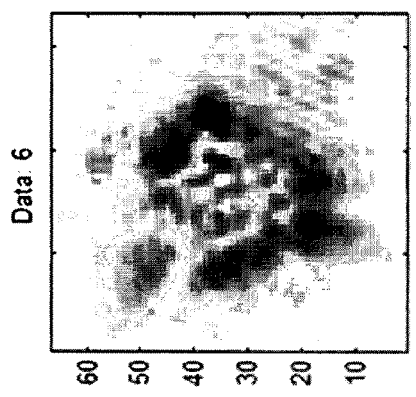
FIG. 10b is a visualization of intensity data generated from the phase retrieval result of FIG. 9b in accordance with an embodiment of the invention.
Figure 10C:
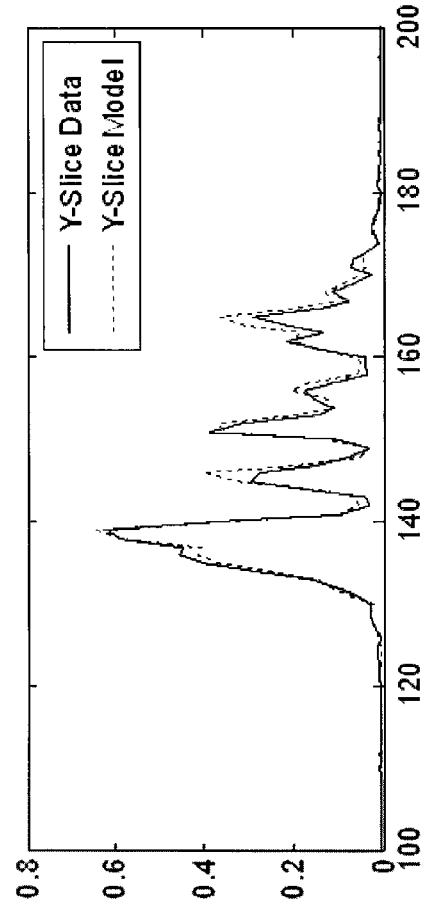
FIGS. 10c-10d are visualizations of a comparison of intensity data of cross-sections of the actual data of FIG. 10a to the estimated data of FIG. 10b in accordance with an embodiment of the invention.
Figure 10D:
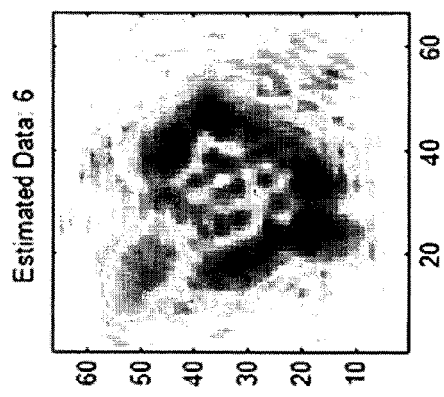

FIGS. 9a-9c correspond to unstacked image data of a negatively defocused image. The hexagonal boundaries, have nothing to do with the testbed telescope pupil, but are simply an efficient way of extracting segment data from the image array with minimum overlap between neighboring images.

The residual, i.e., null, wavefront that is produced by HDM for segment 6, in accordance with one embodiment, as detailed above, is also shown in FIG. 9c. Given that this residual is essentially what is left after the first 15 Zernike basis functions are extracted, i.e., "off-loaded," to the diversity array, stress points on the mirror are clearly visible, illustrating the hexagonal symmetry of the hexapod mount, in addition to a mid-spatial frequency residual that is a product of the mirror figuring process. The dominant aberration term for segment 6 is astigmatism. The overall peak-valley wavefront error (in double pass) is 1.85 waves at a wavelength of $\lambda=633$ nm. The residual RMS wavefront error is 45 nm, which translates to a method convergence stability of $\approx \lambda/30$ RMS in single-pass. This means that when using an order 4 aberration basis set (15 terms) for the aberration transfer described above, the aberration transfer has converged to the $\lambda/30$ level. Different optical systems may have different convergence results.

Using the phase-retrieval results shown in FIG. 9b, a model of the intensity data is constructed and then compared to the actual data. This comparison is made in FIGS. 10a-10d, showing full PSFs and x-y cross sections for both the data and model. The double-pass phase-retrieval results shown in FIG. 9b and FIGS. 10a-10d are typical of the other testbed telescope segments. A summary of these results is shown in FIG. 11a, indicating that the dominant aberration on the segments is astigmatism.

Figure 11B:
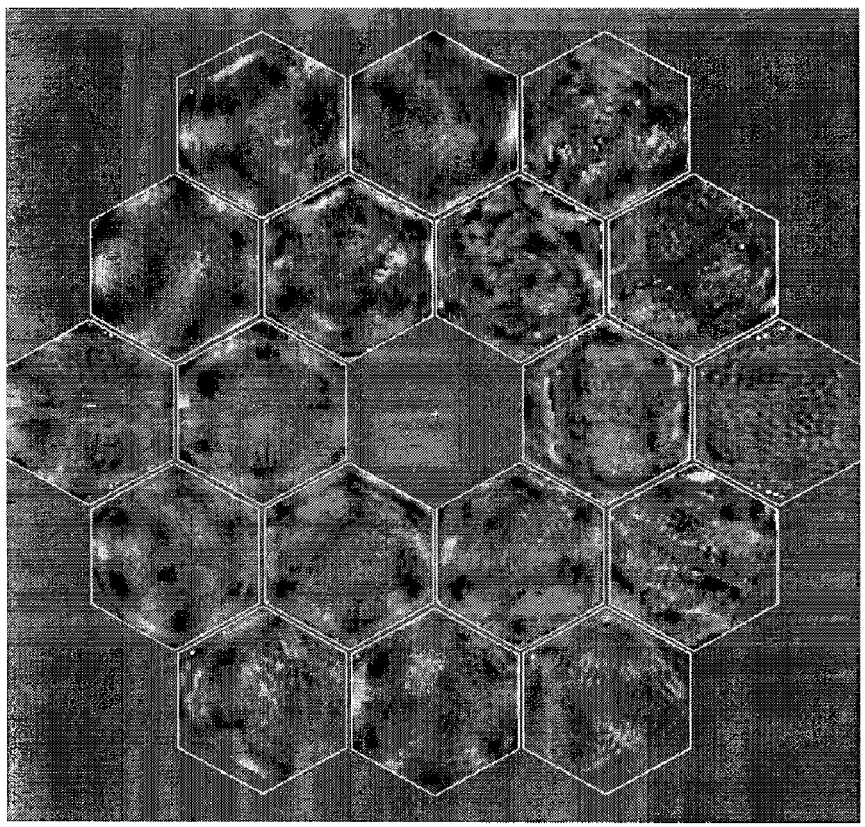
FIG. 11b is a visualization of wavefront residual results resulting from the subtraction of the diversity defocus image of each segment of FIG. 9a from its corresponding phase retrieval result of FIG. 11a in accordance with an embodiment of the invention.
Figure 11A:
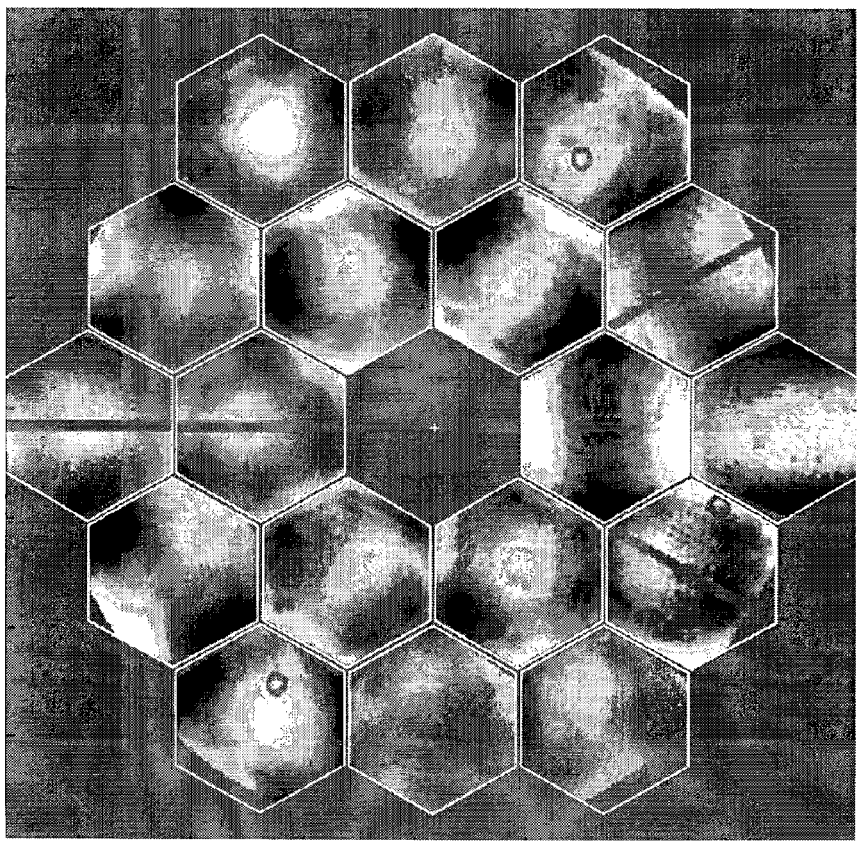
FIG. 11a is a visualization of phase retrieval results from the diversity defocus images of all segments of FIG. 9a in accordance with an embodiment of the invention.

A visualization of wavefront residual results from the subtraction of the diversity defocus image of each segment of FIG. 9a, e.g., the first 15 Zernike basis functions, from its corresponding phase retrieval result of FIG. 11a. The results of FIG. 11b may serve as a diagnostic, illustrating mirror stress points induced by the radius of curvature actuation that is used to correct segment focus errors in the example implementation. Mirror segments requiring the greatest radius of curvature control exhibit a slight edge effect along the interior edges of these segments. Also visible is a mid-spatial frequency residual that is a product of the mirror figuring process. As calculated above, the single-pass residual wavefront error for FIG. 11b is approximately 20 nm RMS or $\lambda/32$, establishing the magnitude of the residuals due to actuation stress and the mirror figuring process.

Figure 12:
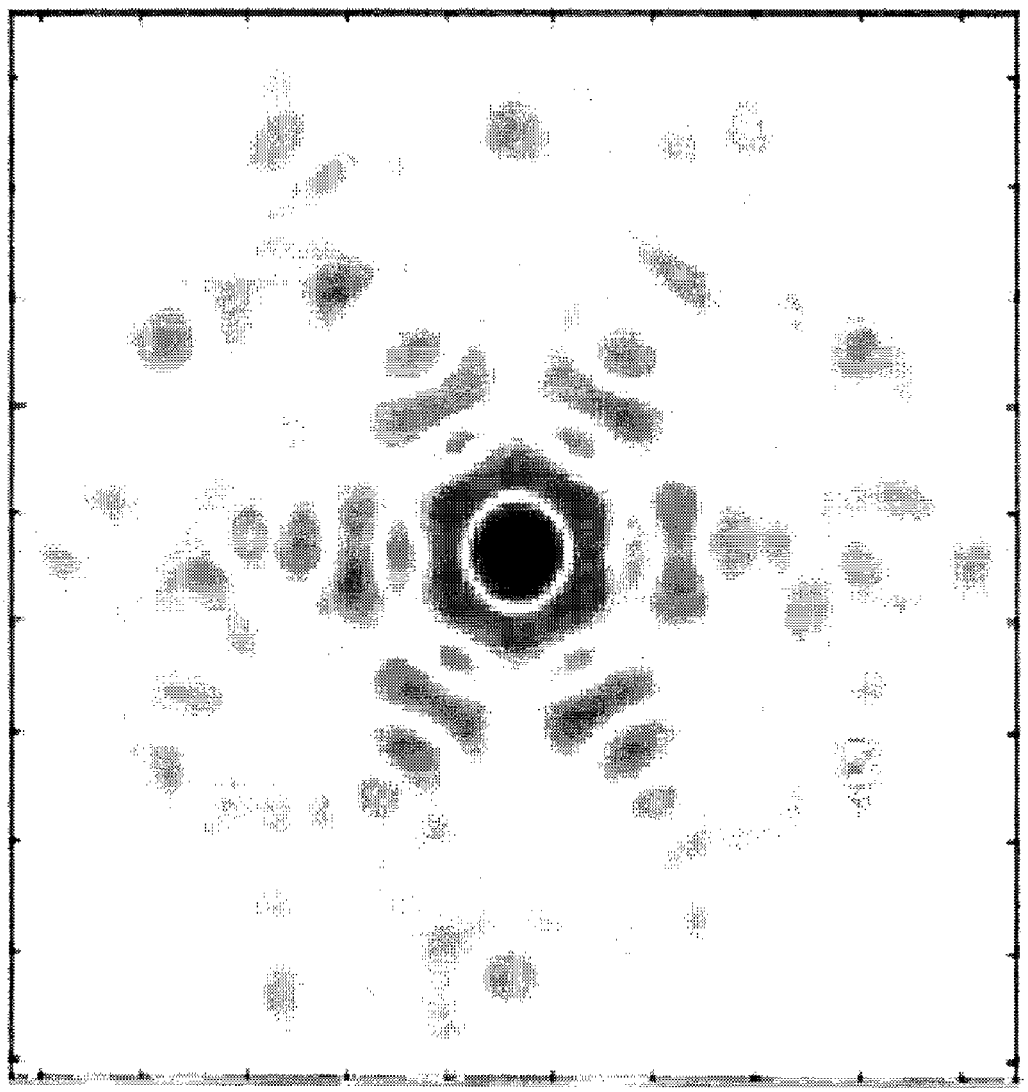
FIG. 12 is a visualization of the calculated point-spread function upon correction for aberrations recovered in FIG. 11a in accordance with an embodiment of the invention.

Upon correction for aberrations recovered in FIG. 11a, a representation of the source producing the wavefront may be calculated. FIG. 12 is a visualization of the calculated point-spread function corresponding to the diversity focus images of FIG. 9a showing good correlation to a laboratory point-source as utilized in generating the example diversity focus images.

While the various embodiments have been described with reference to a narrowband or monochromatic wavefront, the embodiments of the invention are also suitable for use with broadband data, i.e., white light. Traditional iterative-transform phase retrieval approaches have required such narrowband, monochromatic images. However, narrowband filters may reduce signal level and increase detector integration times. Because of the adaptive diversity function of the various embodiments, recovery of phase information and aberrations may be possible without requiring narrowband filtering. In addition to permitting the use of broadband filters, which produce less signal loss and facilitate faster integration times when compared to narrowband filters, the various embodiments may even be used without filtering of the wavefront, thus further reducing system complexity.

The various embodiments described herein include methods of recovering unknown aberrations in a variety of optical systems. Some embodiments use feedback through an adaptive diversity function and may avoid a phase-unwrapping post-processing step typical of conventional iterative-transform phase retrieval methods. In some embodiments, this may yield a more direct computational procedure and may eliminate one or more additional software processes.

It will be apparent to those skilled in the art that various modifications and variations can be made to the structure and methodology described herein. Thus, it should be understood that the invention is not limited to the examples discussed in the specification. Rather, the present invention is intended to cover modifications and variations.

What is claimed is:

1. A method of recovering unknown aberrations in an optical system, comprising:
   collecting intensity data produced by the optical system;
   generating an initial estimate of a phase of the optical system;
   iteratively performing a phase retrieval on the intensity data to generate a phase estimate using an initial diversity function corresponding to the intensity data;
   generating a phase map from the phase retrieval phase estimate;
   decomposing the phase map to generate a decomposition vector;
   generating an updated diversity function by combining the initial diversity function with the decomposition vector;
   generating an updated estimate of the phase of the optical system by removing the initial diversity function from the phase map; and
   repeating the process beginning with iteratively performing a phase retrieval on the intensity data using the updated estimate of the phase of the optical system in place of the initial estimate of the phase of the optical system, and using the updated diversity function in place of the initial diversity function, until a predetermined convergence is achieved.

2. The method of claim 1, wherein the intensity data is generated in response to a source selected from the group consisting of a point source, an extended known source, and an extended unknown source.

3. The method of claim 1, wherein the intensity data comprises broadband data.

4. The method of claim 1, further comprising introducing a known aberration into the optical system prior to collecting intensity data.

5. The method of claim 4, wherein the known aberration comprises at least one of piston, tip, tilt, defocus, astigmatism, coma, spherical, and trefoil.

6. The method of claim 4, wherein the known aberration is at least an order of magnitude greater than a largest expected unknown aberration.

7. The method of claim 1, wherein generating an initial estimate of a phase of the optical system comprises presuming the phase to have a predetermined value.

8. The method of claim 1, wherein decomposing the phase map comprises decomposing the phase map into a basis set suitable for a given sampling and aperture shape of the optical system.

9. The method of claim 1, wherein the predetermined convergence is a residual RMS wavefront error of less than a wavelength of the intensity data.

10. A method of recovering unknown aberrations in an optical system, comprising:
- introducing one or more known aberrations into the optical system;
- for each known aberration, collecting a set of intensity data produced by the optical system;
- generating an initial estimate of a phase of the optical system;
- iteratively performing a phase retrieval on each set of the intensity data to generate a phase estimate using an initial diversity function corresponding to the sets of the intensity data;
- combining each of the phase retrieval phase estimates to generate a phase map;
- decomposing the phase map to generate a decomposition vector;
- generating an updated diversity function by combining the initial diversity function with the decomposition vector;
- generating an updated estimate of the phase of the optical system by removing the initial diversity function from the phase map; and
- repeating the process beginning with iteratively performing a phase retrieval on each set of the intensity data using the updated estimate of the phase of the optical system in place of the initial estimate of the phase of the optical system, and using the updated diversity function in place of the initial diversity function, until a predetermined convergence is achieved.

11. The method of claim 10, wherein the intensity data is generated in response to a source selected from the group consisting of a point source, an extended known source, and an extended unknown source.

12. The method of claim 10, wherein the intensity data comprises broadband data.

13. The method of claim 10, wherein the one or more known aberrations are chosen from piston, tip, tilt, defocus, astigmatism, coma, spherical, and trefoil.

14. The method of claim 10, wherein the one or more known aberrations comprise defocus.

15. The method of claim 10, wherein combining each of the phase retrieval phase estimates comprises generating a weighted average of the individual phase retrieval phase estimates.

16. The method of claim 10, wherein combining each of the phase retrieval phase estimates further comprises filtering the phase retrieval phase estimates prior to generating the phase map.

17. The method of claim 10, wherein generating an initial estimate of a phase of the optical system comprises presuming the phase to have a predetermined value.

18. The method of claim 10, wherein decomposing the phase map comprises decomposing the phase map into a basis set suitable for a given sampling and aperture shape of the optical system.

19. The method of claim 10, wherein the predetermined convergence is a residual RMS wavefront error of less than a wavelength of the intensity data.

20. The method of claim 10, further comprising:
- generating updated intensity data using at least some components of the updated diversity function; and
- comparing the updated intensity data with the collected intensity data to validate convergence.

* * * * *